(12) United States Patent
Yoon

(10) Patent No.: US 7,838,063 B2
(45) Date of Patent: Nov. 23, 2010

(54) PROCESS FOR PREPARATION OF ABSORPTION LAYER OF SOLAR CELL

(75) Inventor: Seokhyun Yoon, Daejeon (KR)

(73) Assignee: LG Chem, Ltd. (KR)

( * ) Notice: Subject to any disclaimer, the term of this patent is extended or adjusted under 35 U.S.C. 154(b) by 1119 days.

(21) Appl. No.: 11/513,844

(22) Filed: Aug. 31, 2006

(65) Prior Publication Data
US 2007/0054435 A1    Mar. 8, 2007

(30) Foreign Application Priority Data
Sep. 6, 2005    (KR)    ............ 10-2005-0082723

(51) Int. Cl.
B05D 5/12    (2006.01)
B05D 3/02    (2006.01)
(52) U.S. Cl. .............. 427/76; 427/383.1; 136/262; 136/264; 136/265
(58) Field of Classification Search .......... 136/256, 136/262, 264, 265; 427/74, 76, 372.2, 383.1, 427/383.3
See application file for complete search history.

(56) References Cited

U.S. PATENT DOCUMENTS 4,940,604 A * 7/1990 Suyama et al. ............ 427/76
2002/0106873 A1* 8/2002 Beck et al. ............ 438/482
2004/0218499 A1* 11/2004 Chaiken ............ 369/94
2005/0183767 A1* 8/2005 Yu et al. ............ 136/263

OTHER PUBLICATIONS

H. Winkler, A. Birkner, V. Hagen, I. Wolf, R. Schmechel, H.V. Seggern, and R.A. Fischer, Advanced materials, 11 (17) 1444, 1999.
S. Yang and D.F. Kelley, J. Phys. Chem. B, 109, 12701, 2005.
V. Chikan, D.F. Kelly, Nano Letters, 141, 2, 2002.

* cited by examiner

Primary Examiner—Timothy H Meeks
Assistant Examiner—James Lin
(74) Attorney, Agent, or Firm—Cantor Colburn LLP

(57) ABSTRACT

Provided is a process for preparing an absorption layer of a solar cell composed of a 1B-3A-Se compound, comprising applying a metal selenide nanoparticle as a precursor material to a base material and subjecting the applied nanoparticle to thermal processing, whereby the crystal size of the 1B-3A-Se compound can be increased as compared to a conventional method using a metal in the form of an oxide as a precursor material, consequently resulting in an enhanced efficiency of the solar cell, and the manufacturing process can be simplified with omission of hydrogen reduction and selenidation processes.

7 Claims, 5 Drawing Sheets

US 7,838,063 B2

PROCESS FOR PREPARATION OF ABSORPTION LAYER OF SOLAR CELL

FIELD OF THE INVENTION

The present invention relates to a process for preparing an absorption layer of a solar cell. More specifically, the present invention relates to a process for preparing an absorption layer of a solar cell composed of a Group 1B metal-Group 3A metal-Selenium compound (hereinafter, referred to as "1B-3A-Se compound"), comprising applying a metal selenide nanoparticle as a precursor material to a base material and subjecting the applied nanoparticle to rapid thermal processing (RTP), whereby the crystal size of the 1B-3A-Se compound can be increased as compared to a conventional method using a metal in the form of an oxide as a precursor material, consequently resulting in an enhanced efficiency of the solar cell, and the manufacturing process can be further simplified without a need for hydrogen reduction and selenidation processes.

BACKGROUND OF THE INVENTION

Methods of preparing an absorption layer of a solar cell using a material such as Cu(In,Ga)Se2 (abbreviated as CIGS-based absorption layer) as an absorption layer may be broadly divided into two methods, i.e., one method involving vacuum deposition, and the other method involving applying a precursor material under non-vacuum conditions, followed by high-temperature thermal processing. Of these methods, the former vacuum deposition method is advantageously capable of preparing a high-efficiency absorption layer, but suffers from shortcomings such as low uniformity upon the preparation of an absorption layer having a large area and a need for use of expensive equipment. Whereas, the latter method including high-temperature thermal processing following application of the precursor material is capable of uniformly preparing a large-area absorption layer, but disadvantageously results in a poor efficiency of the absorption layer.

As a method that is most feasible to be put to practical use for the industrial scale production of an absorption layer among the above-mentioned methods for preparing an absorption layer utilizing a precursor material, mention may be made of a method of preparing an absorption layer by coating a paste of a metal oxide mixture on a base material and subjecting the coating to thermal processing. This method provides an advantage in that a uniform absorption layer can be prepared at low production costs, but the metal oxides used as the precursor are very highly stable in terms of chemical and thermal properties thereof and therefore it is difficult to achieve large-sized crystals in the final absorption layer, consequently leading to a decreased efficiency of the absorption layer.

SUMMARY OF THE INVENTION

Therefore, the present invention has been made to solve the above problems and other technical problems that have yet to be resolved.

That is, the present invention has been made in view of the above problems, and it is an object of the present invention to provide a process for preparing an absorption layer of a solar cell, comprising applying a mixture of metal selenides such as copper selenides, indium selenides and gallium selenides to a base material and subjecting the-thus applied mixture to rapid thermal processing (RTP), thereby increasing the crystal size of the final absorption layer, consequently being capable of significantly increasing the efficiency of the absorption layer and capable of significantly reducing manufacturing processes.

It is another object of the present invention to provide a novel metal selenide mixture paste which is used in the above-mentioned process.

It is a yet another object of the present invention to provide a solar cell having a high efficiency which is prepared by the above-mentioned process.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF PREFERRED EMBODIMENTS

Hereinafter, the present invention will be described in more detail.

In accordance with an aspect of the present invention, the above and other objects can be accomplished by the provision of a process for preparing an absorption layer of a solar cell composed of a 1B-3A-Se compound, comprising (a) preparing a mixture paste of Group 1B metal selenide particles and Group 3A metal selenide particles as reactants;

(b) applying the paste to a base material; and (c) subjecting the resulting coating layer to rapid thermal processing.

Such a process of the present invention can provide an absorption layer of a solar cell having an improved efficiency, via the use of fine particles of metal selenides, instead of metal oxides which have been conventionally used as precursor materials for preparing an absorption layer of a solar cell.

Figure 1:
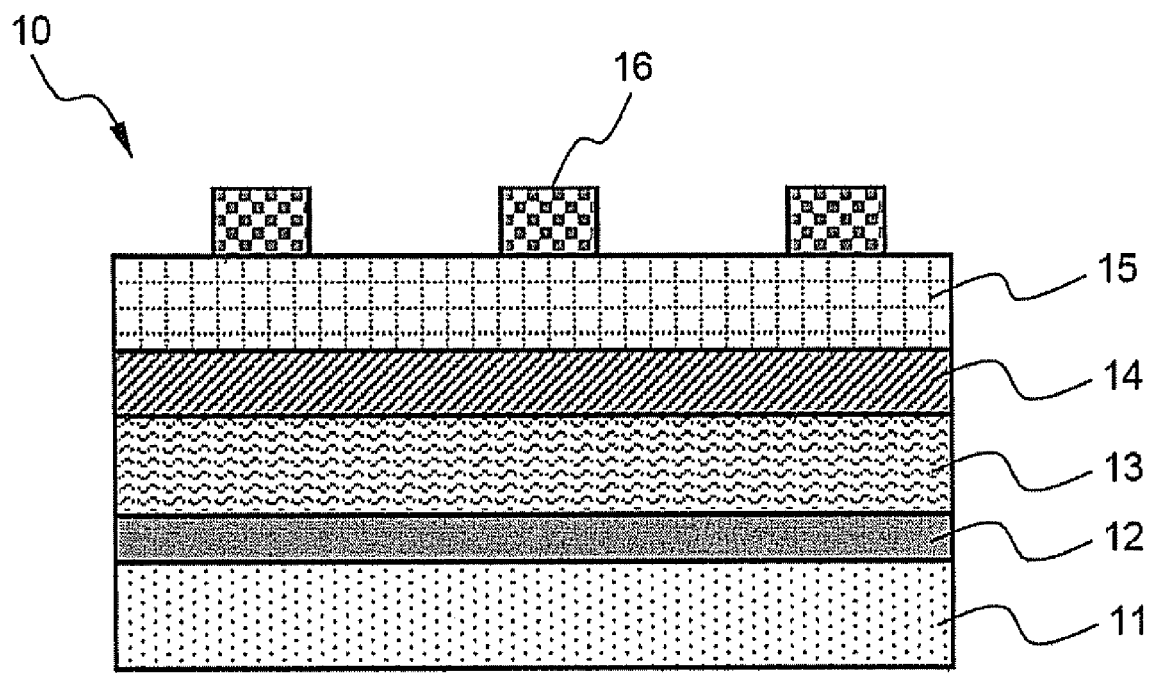
FIG. 1 is a schematic cross-sectional view of a solar cell to which an absorption layer of a solar cell according to one embodiment of the present invention is applied.

FIG. 1 is a cross-sectional view schematically showing the constitution of a solar cell having a multi-layered structure. Referring to FIG. 1, a solar cell 10 is comprised of a glass substrate 11, a conductive layer 12, a p-type absorption layer 13, an n-type buffer layer 14 and an n-type transparent window layer 15 which are sequentially disposed. Further, as shown in FIG. 1, finger patterns 16 may be applied thereon, but these finger patterns are not always necessary for the constitution of the solar cell. The finger patterns 16 increase the efficiency of the solar cell, via optional application thereof to reduce resistance caused by the transparent window layer 15.

The present invention is characterized by a process of preparing the absorption layer 13 in the above constitution of the solar cell. Hereinafter, the process of the present invention will be more specifically described step by step.

In Step (a), a mixture paste of Group 1B metal selenide particles and Group 3A metal selenide particles as reactants is prepared.

Typical examples of Group 1B metal selenides may include copper selenide (Cu—Se), silver selenide (Ag—Se), gold selenide (Au—Se) and the like. Particularly preferred is Cu—Se.

Typical examples of Group 3A metal selenides may include indium selenide (In—Se), gallium selenide (Ga—Se), aluminum selenide (Al—Se), titanium selenide (Ti—Se) and the like. Particularly preferred are In—Se and Ga—Se. For example, In—Se may be in the form of InSe or In2Se3, and Ga—Se may be in the form of GaSe or Ga2Se3.

The particle diameter of the metal selenide particles is in the range of 5 nm to 10 μm, preferably 50 nm to 5 μm. Since these selenide particles have a very small size, it is possible to substantially reduce a distance for which respective atoms inside nanoparticles should migrate via diffusion in order to perform reaction, thereby being capable of obtaining a large crystal size and in turn enhancing the efficiency of the absorption layer. Therefore, the smaller particle diameter is preferred as long as it falls within the above range, but it is undesirably difficult to prepare excessively small sized-particles.

A mixing ratio of metal selenide particles in the mixture paste may be determined depending upon various factors such as kinds of elements to be used, a desired ratio of components in the absorption layer, and the like. For example, when Cu—Se is used as the Group 1B metal selenide, and In—Se and/or Ga—Se are used as the Group 3A metal selenide, a mole ratio between respective metals, i.e., Cu/(In+Ga) is in a range of 0.6 to 1.5 and Ga/(Ga+In) is in a range of 0 to 0.5.

As metal selenide particles used in the present invention, any particles prepared by known methods or newly developed methods may be employed as long as they are suitable for application thereof to the process of the present invention.

For example, copper selenide nanoparticles may be prepared by heating a solution of copper chloride (CuCl2) dissolved in tri-n-octylphosphine (TOP) to 100° C., injecting tri-n-octylphosphine oxide (TOPO) thereto, adding tri-n-octylphosphine selenide (TOPSe) to the reaction mixture at a temperature of 250° C., precipitating the reactants in methanol, followed by separating a desired product (see H. Winkler, A. Birkner, V. Hagen, I. Wolf, R. Schmchel, H. V. Seggern, and R. A. Fischer, Advanced materials, 11 (17) 1444, 1999). Alternatively, copper selenide nanoparticles may also be prepared by adding copper chloride and selenious acid (H2SeO3) to a suitable solvent, and subjecting the resulting solution to ultrasonic vibration, thereby inducing chemical reaction. Further, copper selenide nanoparticles may be prepared by adding a copper salt and selenious acid to a suitable solvent and heating the resulting mixture. Such a method is very economical due to the use of inexpensive organic solvents such as ethylene glycol, butanediol and the like.

Gallium selenide nanoparticles may be prepared by mixing a TOPSe solution with a TOPO solution in which TOP was dissolved, reacting the resulting mixture with trimethylgallium, and subjecting the reactants to methanol extraction, followed by separating the desired product (see V. Chikan, D. F. Kelly, Nano Letters, 141, 2, 2002).

Indium selenide nanoparticles may be prepared by mixing a solution, which was prepared by injection of selenium and TOPO into TOP, at 150° C., heating the resulting mixture to 250° C., and reacting the resulting reaction mixture with a TOP solution in which trimethylindium was dissolved (see S. Yang and D. F. Kelley, J. Phys. Chem. B, 109, 12701, 2005). Alternatively, indium selenide nanoparticles may be prepared by adding an indium salt and selenious acid (H2SeO3) to a suitable solvent, and heating the resulting mixture.

In Step (b), the thus-prepared paste is applied to a base material which is designated by reference numerals 11 and 12 in FIG. 1. Herein, the base material is divided into two parts, i.e., a substrate 11 and a conductive layer 12. The conductive layer 12 may be formed using common metals such as molybdenum (Mo), tungsten (W), tantalum (Ta), titanium (Ti), gold (Au) and the like. Preferred is molybdenum (Mo). Materials for the substrate 11 may include, for example glass, alumina and polyimide, and conductive materials such as molybdenum (Mo), tungsten (W), tantalum (Ta), titanium (Ti), aluminum (Al), nickel (Ni) and graphite. Where the substrate 11 is formed of the conductive material, the base material may be composed of a single layer without formation of the conductive layer 12.

The coating layer may be composed of a monolayer or multilayer structure and the total thickness thereof is preferably in the range of 3 to 5 μm. As a specific example of the formation of the coating layer having a multilayer structure (bilayer or trilayer structure), when it is desired to form the coating layer having the trilayer structure, a bottom first layer (a mole ratio of Cu/(In+Ga)=0 to 0.9) is applied to a thickness of 0.1 to 1.0 μm, the intermediate second layer (a mole ratio of Cu/(In+Ga)=0.8 to 3.0) is applied to a thickness of 0.5 to 3.0 μm, and a top third layer (a mole ratio of Cu/(In+Ga)=0 to 0.9) is applied to a thickness of 0.1 to 1.0 μm. When the coating layer is constituted in the form of the multilayer structure as described above, ratios of Cu/(In+Ga) and Ga/(Ga+In) vary in the thickness direction of the coating layer during rapid thermal processing of the coating layer, which advantageously enables the final absorption layer to have electrical properties suitable for high-efficiency solar cells.

Application of the paste may be carried out using conventional methods well-known in the art, such as doctor blade coating, spray printing, gravure printing, ink printing and the like.

The coating layer may be further subjected to a drying process at a low temperature of about 50 to 150° C. The above coating layer having the multilayer structure can be constituted by sequentially repeating the application processes as described above.

In Step (c), the coating layer thus formed is subjected to rapid thermal processing.

As conventional arts involve formation of the coating layer using a mixture paste of metal oxide particles, the use of a reducing agent such as hydrogen is necessary in order to reduce oxide particles in the thermal processing step. That is, conventional arts have required the hydrogen reduction process in conjunction with or prior to the thermal processing process. Further, since initial reactants contain no selenium (Se) in the conventional arts, the selenidation process must be performed after the thermal processing step. The selenidation process is effected by providing H2Se, (CH3)2Se, or (C2H5)2Se under heating conditions. Contrary to conventional arts, the present invention does not require these hydrogen reduction and selenidation processes.

Further, according to the conventional methods as described above, respective corresponding metals are present primarily in the form of Cu—In alloy, Cu—Ga alloy and Cu—In—Ga alloy in the coating layer after the thermal processing step and therefore it is not easy to realize a large crystal size and a Cu(In,Ga)Se2 absorption layer suitable for high-efficiency solar cells, via selenidation of those metals. Whereas, the present invention can take advantage of properties of CuSe which can be present as a liquid phase at a relatively low temperature, via reaction of particles such as Cu—Se, In—Se and Ga—Se during the thermal processing process, and as a result, enables preparation of an absorption layer having a large crystal size.

Rapid thermal processing in the present invention may be carried out at a temperature of 400 to 600° C. for 1 to 30 min. Selection of rapid thermal processing among various heating methods is because this method is most suitable to achieve a temperature sufficient for reaction of the coating layer and crystal growth while minimizing thermal load applied to the substrate. Therefore, an excessively low thermal processing temperature or an excessively short thermal processing period undesirably results in problems such as no reaction of the coating layer and a decreased crystal size. Conversely, an excessively high thermal processing temperature or an excessively long thermal processing period undesirably results in problems associated with deformation of the substrate. More preferably, thermal processing may be carried out in the range of 400 to 500° C.

The manufacturing method of the present invention may additionally include other processes within the ranges that are not detrimental to desired effects of the present invention, and it should be understood that all of those additional processes fall within the scope of the present invention.

In accordance with another aspect of the present invention, there is provided a novel metal selenide mixture paste that is utilizable in the above-mentioned method. More specifically, the mixture paste of the present invention is comprised of Group 1B metal selenide particles and Group 3A metal selenide particles.

To the best of our knowledge, no case has been found hitherto in the conventional arts about the fact that the metal selenide mixture paste of the present invention can be useful for various applications including practical use thereof as a reactant for preparing absorption layers of solar cells.

As discussed hereinbefore, the metal selenide mixture paste of the present invention may be prepared to have various compositions, depending upon kinds of Group 1B metals and Group 3A metals. Preferably, the metal selenide mixture paste may be a composition containing In—Se particles and Cu—Se particles.

There is no particular limit to the content of solids in the paste of the present invention which may vary depending upon the desired applications in which the paste is used.

A solvent constituting the paste may include, for example water, alcohol-based compounds, glycol-based compounds, carbonate-based compounds and the like. These solvent materials may be used alone or in any combination thereof.

Dopants such as Na, K, Ni, P, As, Sb and Bi may be added to the paste of the present invention. These dopant materials may be used alone or in any combination thereof. Where the absorption layer for the solar cell is prepared using a dopant-containing paste, incorporation of the dopant into the paste can afford improvement in electrical properties of the absorption layer and increases in the crystal size of the absorption layer.

Further, the paste may further include a binder that is added to form a stable coating layer on the base material. Preferred examples of the binders utilizable in the present invention may include ethyl cellulose, polypropylene glycol and polypropylene carbonate, which may be used alone or in any combination thereof.

The paste may be prepared using various conventional methods known in the art, for example ball milling. Upon preparing the paste by ball milling, water or ethylene glycol monophenyl ether may be used as a solvent.

In accordance with yet another aspect of the present invention, there is provided a solar cell comprising an absorption layer which is prepared by the above-mentioned process.

Compounds produced on the absorption layer thus prepared can be represented by Formula 1B-3A-Se. As a typical compound of Formula 1B-3A-Se, mention may be made of Cu(In,Ga)Se2. The 1B-3A-Se compound in the absorption layer has a crystal size of 0.5 to 1.5 μm. This range of the crystal size shows that it is possible to obtain a substantially increased level of the crystal size as compared to conventional arts, even though compounds of interest were prepared by significantly simplified processes as compared to those of conventional arts.

Solar cells comprising an absorption layer having such a large crystal size exhibit excellent efficiency.

EXAMPLES

Now, the present invention will be described in more detail with reference to the following examples. These examples are provided only for illustrating the present invention and should not be construed as limiting the scope and spirit of the present invention.

Example 1

Preparation of CIS from CuSe—InSe 0.03 M copper nitrate and 0.02 M selenious acid were mixed in 250 mL of ethylene glycol. The resulting reaction solution was heated to 170° C. and reacted for about 3 hours to prepare CuSe nanoparticles. Alternatively, polyethylene glycol or butanediol may be used instead of ethylene glycol as a reaction solvent.

Further, 0.02 M indium nitrate and 0.02 M selenious acid were mixed in 250 mL of diethylene glycol or butanediol. The resulting reaction solution was heated to 170° C. and reacted for about 3 hours to prepare InSe nanoparticles.

Then, using α-terpineol and propylene carbonate (PC) as solvents, and polypropylene carbonate as a binder, the thus-prepared CuSe and InSe nanoparticle powder was dispersed to prepare a paste. Herein, the weight ratio between individual components was terpineol:PC:polypropylene carbonate:powder=43.34:26.65:5.01:25. The thus-prepared paste was coated on a glass substrate using a doctor blade, followed by rapid thermal annealing (RTA) at 430° C. for 2 min under N2 atmosphere, thereby preparing CuInSe2 (hereinafter, referred to as 'CIS').

Figure 2:
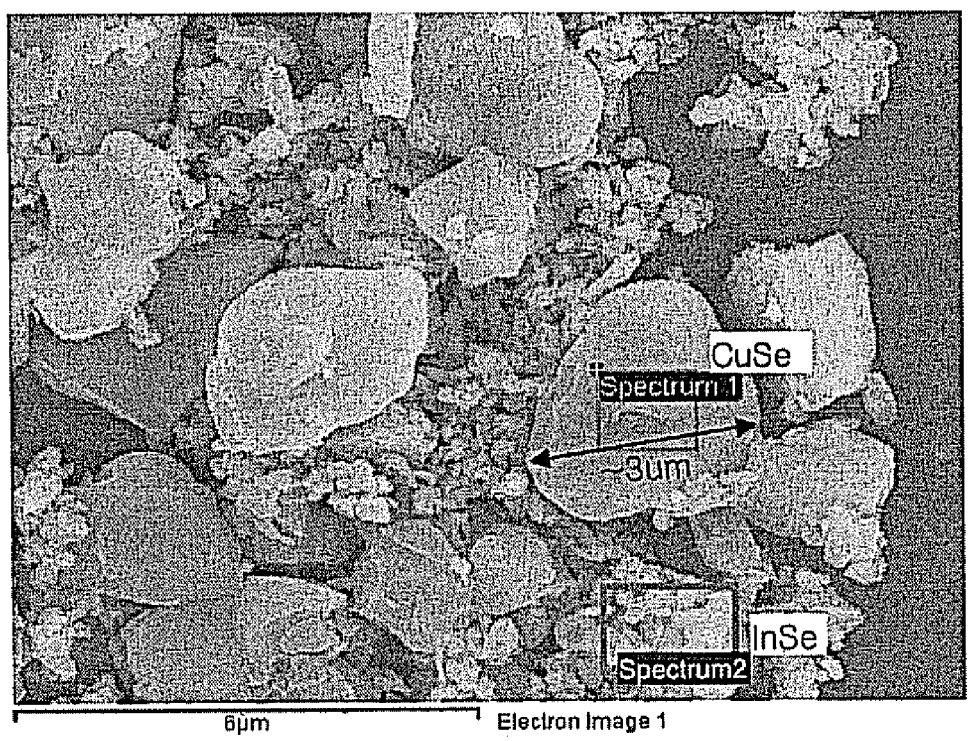
FIGS. 2 and 3 are respectively SEMs of CuInSe2 compound crystals prepared in Example 1 of the present invention.
Figure 3:
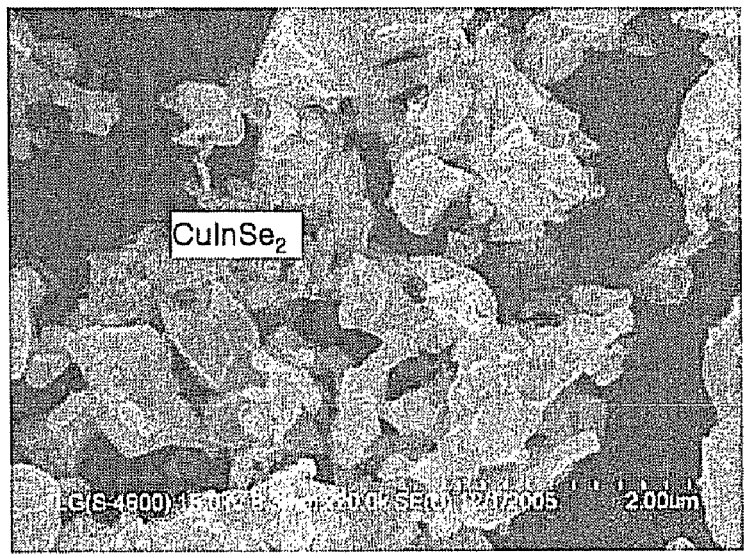

FIGS. 2 and 3 show SEMs of CIS crystals before and after RTA, respectively. Micrographs disclosed in FIGS. 2 and 3 were respectively obtained under a scanning electron microscope (model JSM-6340F, JEOL, Japan) at an accelerating voltage of 15 keV. As shown in these micrographs, it can be seen that CIS crystals as particles having a slightly irregular shape were finally obtained with disappearance of fine InSe particles which were present prior to performing rapid thermal annealing.

Figure 4:
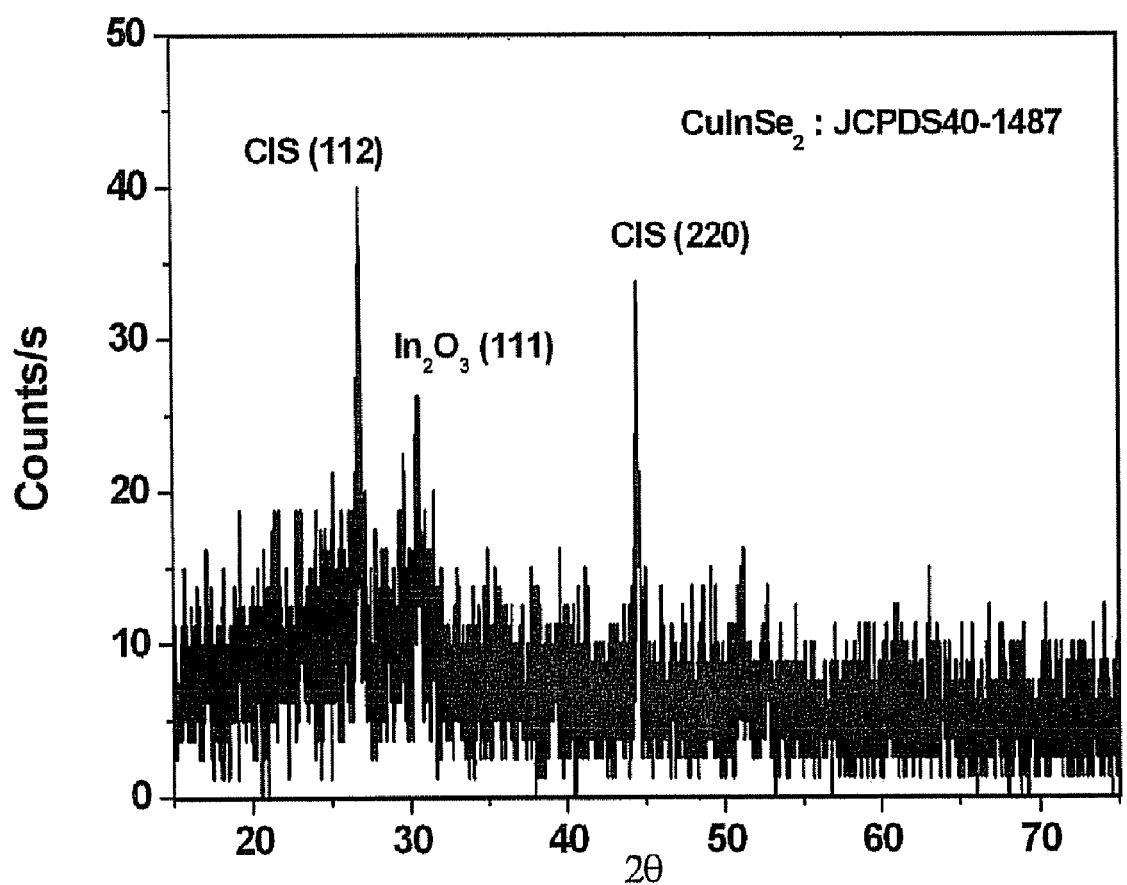
FIG. 4 is an XRD (X-ray Diffraction) graph for CuInSe2 compound prepared in Example 1 of the present invention.

Further, in order to confirm a phase of the thus-synthesized material, XRD (X-ray Diffraction) analysis was conducted using a D4 endeavor diffractometer (Bruker, USA). The results thus obtained are given in FIG. 4. As shown in FIG. 4, it can be seen that desired CIS was synthesized via confirmation of peaks (1 1 2) and (2 2 0)/(2 0 4), which respectively correspond to CIS, at around 2θ=26.7° and 44.2°.

Example 2

Preparation of CIS from CuSe2—InSe 0.03 M copper nitrate and 0.03 M selenious acid were mixed in 250 mL of 1,3-butanediol. The same procedure was repeated as in Example 1, except that the resulting reaction solution was heated to 150° C. and reacted for about 3 hours to prepare CuSe2 nanoparticles.

Figure 5:
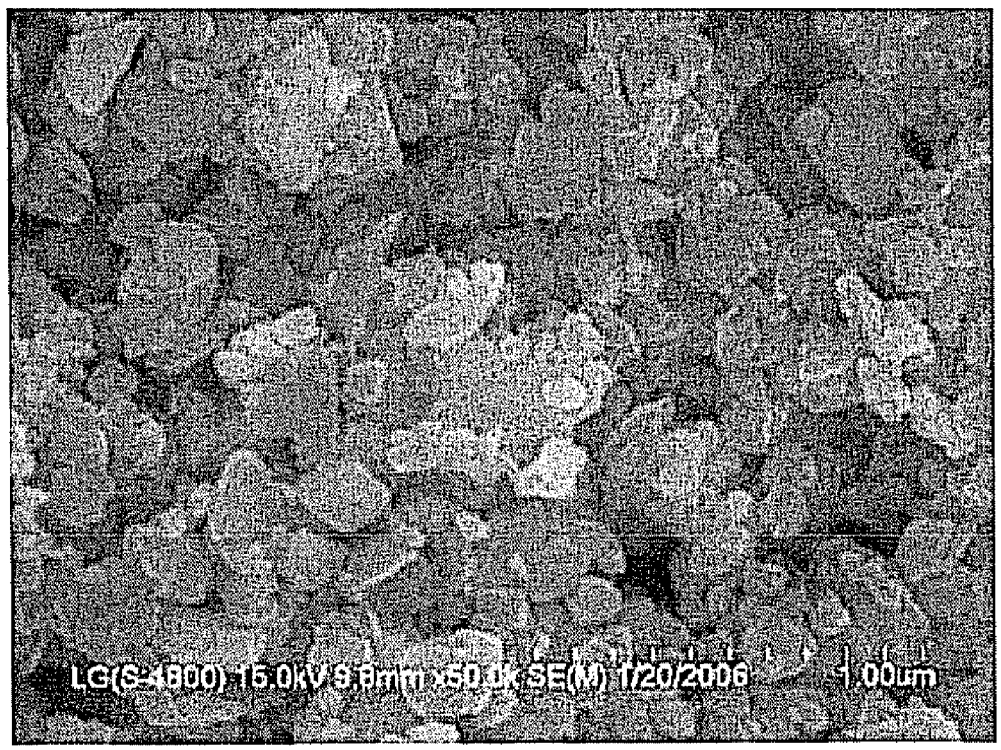
FIGS. 5 and 6 are respectively SEMs of CuInSe2 compound crystals prepared in Example 2 of the present invention.
Figure 6:
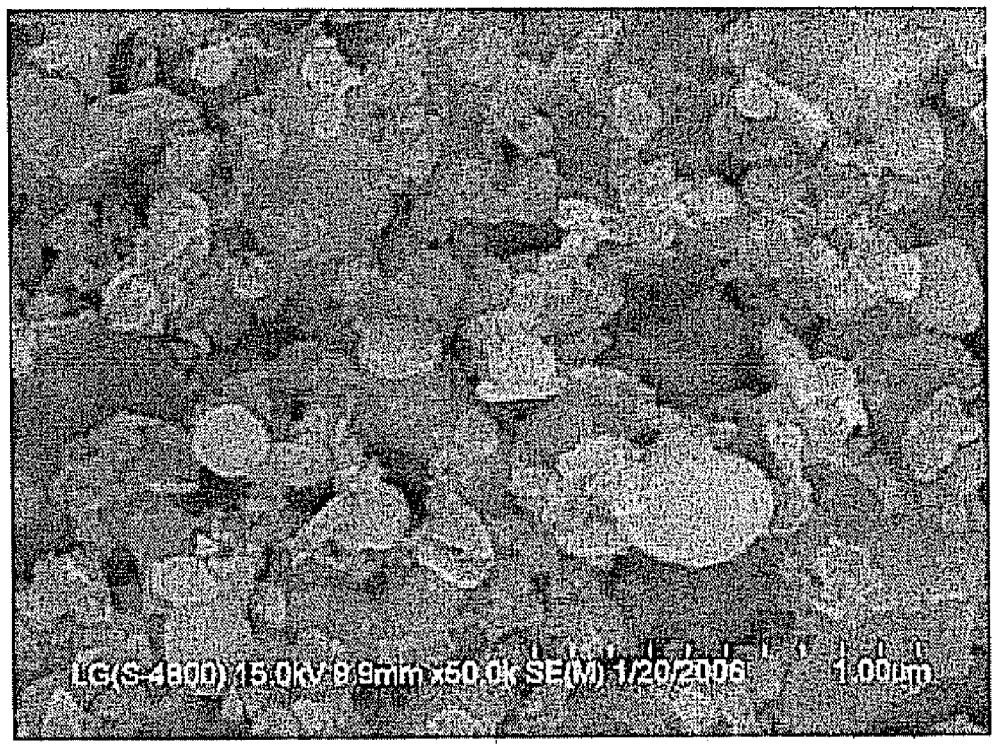
Figure 7:
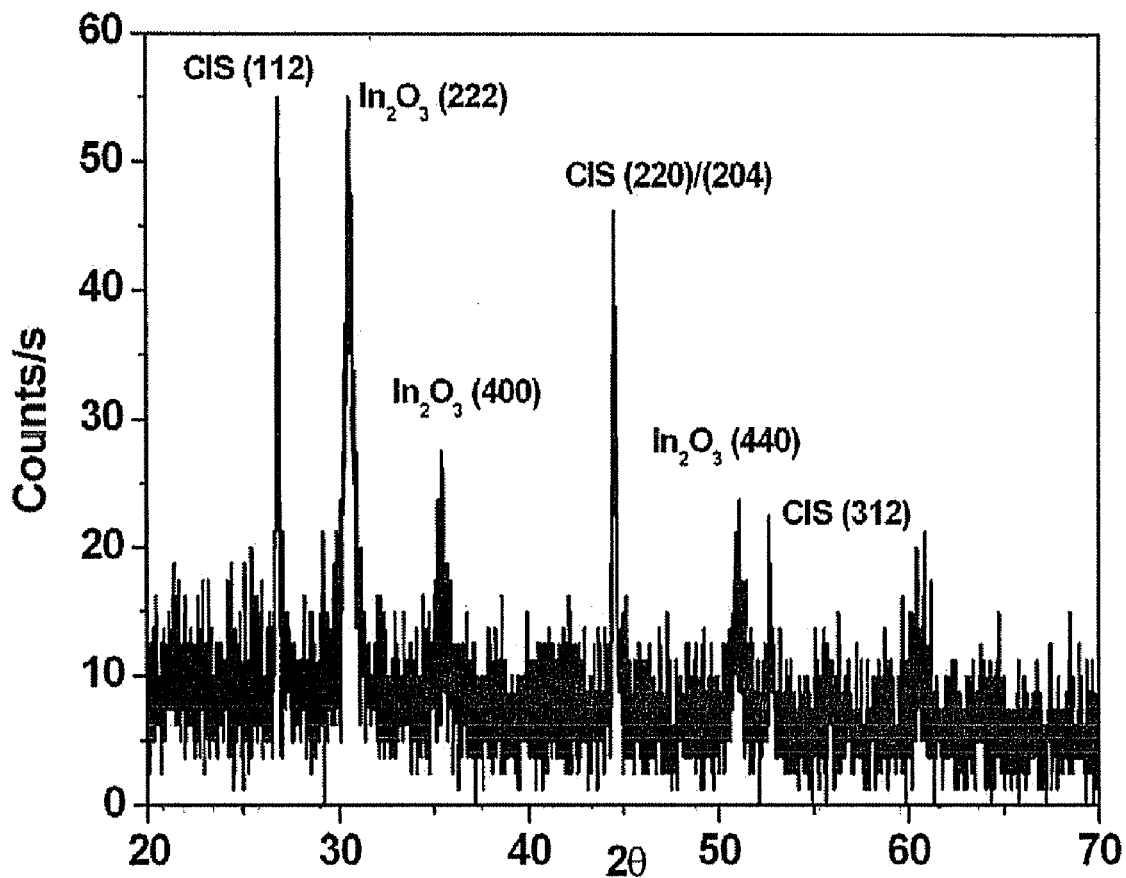
FIG. 7 is an XRD (X-ray Diffraction) graph for CuInSe2 compound prepared in Example 2 of the present invention.

FIGS. 5 and 6 show SEMs of CIS crystals before and after RTA, respectively. As shown in these micrographs, it can be seen that the crystals finally obtained are composed of particles having a slightly irregular shape. In addition, the results of XRD analysis are given in FIG. 7. As shown in FIG. 7, it can be seen that desired CIS was synthesized via confirmation of peaks (1 1 2), (2 2 0)/(2 0 4), and (3 1 2), which respectively correspond to CIS, at around 2θ=26.7°, 44.2° and 52.4°.

Example 3

Preparation of CIS from CuSe2—InSe 0.03 M copper nitrate and 0.06 M selenious acid were mixed in 250 mL of 1,4-butanediol. The resulting reaction solution was heated to 150° C. and reacted for about 3 hours to prepare CuSe2 nanoparticles. Alternatively, polyethylene glycol or diethylene glycol may be used instead of 1,4-butanediol as a reaction solvent.

Further, 0.02 M indium nitrate and 0.02 M selenious acid were mixed in 250 mL of diethylene glycol or butanediol. The resulting reaction solution was heated to 170° C. and reacted for about 3 hours to prepare InSe nanoparticles.

Then, using α-terpineol and propylene carbonate (PC) as solvents, and polypropylene carbonate as a binder, the thus-prepared CuSe2 and InSe nanoparticle powder was dispersed to prepare a paste. Herein, the weight (%) ratio between individual components was terpineol:PC:polypropylene carbonate:powder=35:35:5.0:25. The thus-prepared paste was coated on a glass substrate using a doctor blade, followed by rapid thermal annealing at 430° C. for 2 min under N2 atmosphere, thereby preparing CIS.

Figure 8:
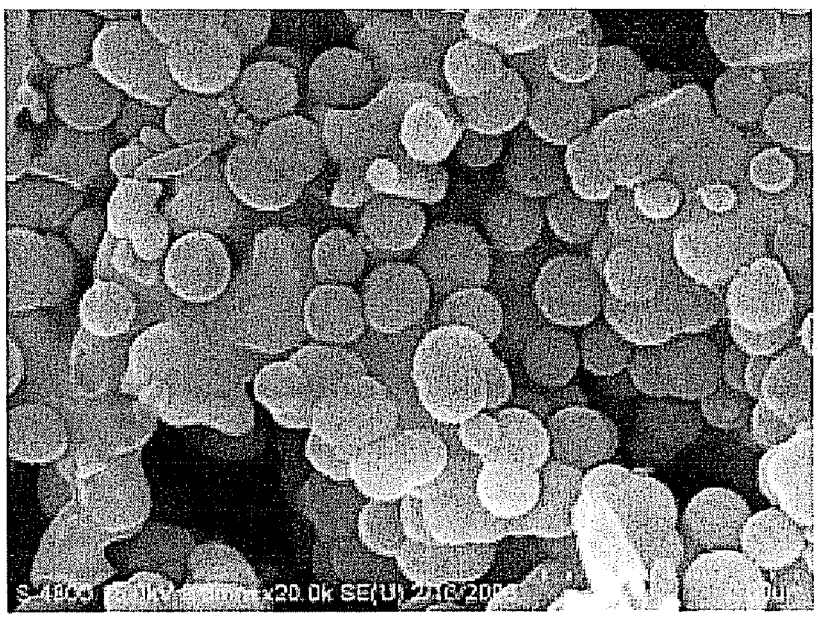
FIGS. 8 and 9 are respectively SEMs of CuInSe2 compound crystals prepared in Example 3 of the present invention.
Figure 9:
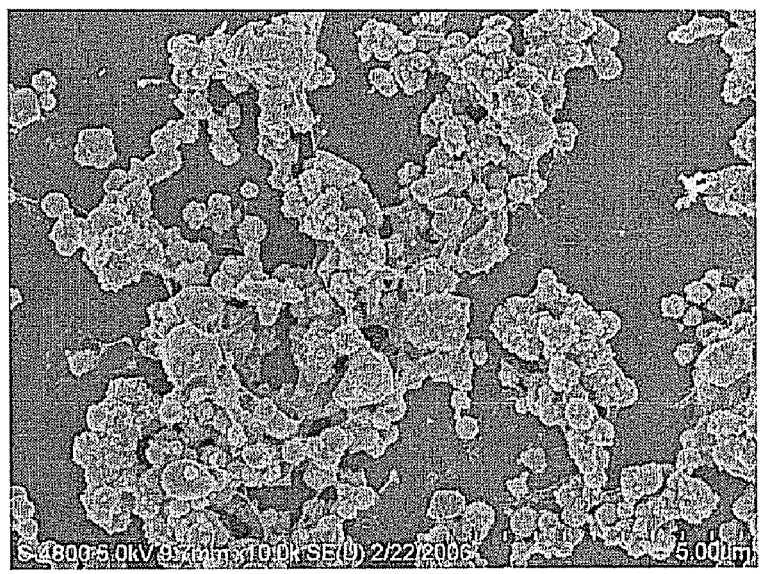

FIGS. 8 and 9 show SEMs of CIS crystals before and after RTA, respectively. As shown in these micrographs, it can be seen that crystals composed of particles having a slightly irregular shape were obtained from spherical and regular crystal form of crystals as appeared prior to performing rapid thermal annealing.

Figure 10:
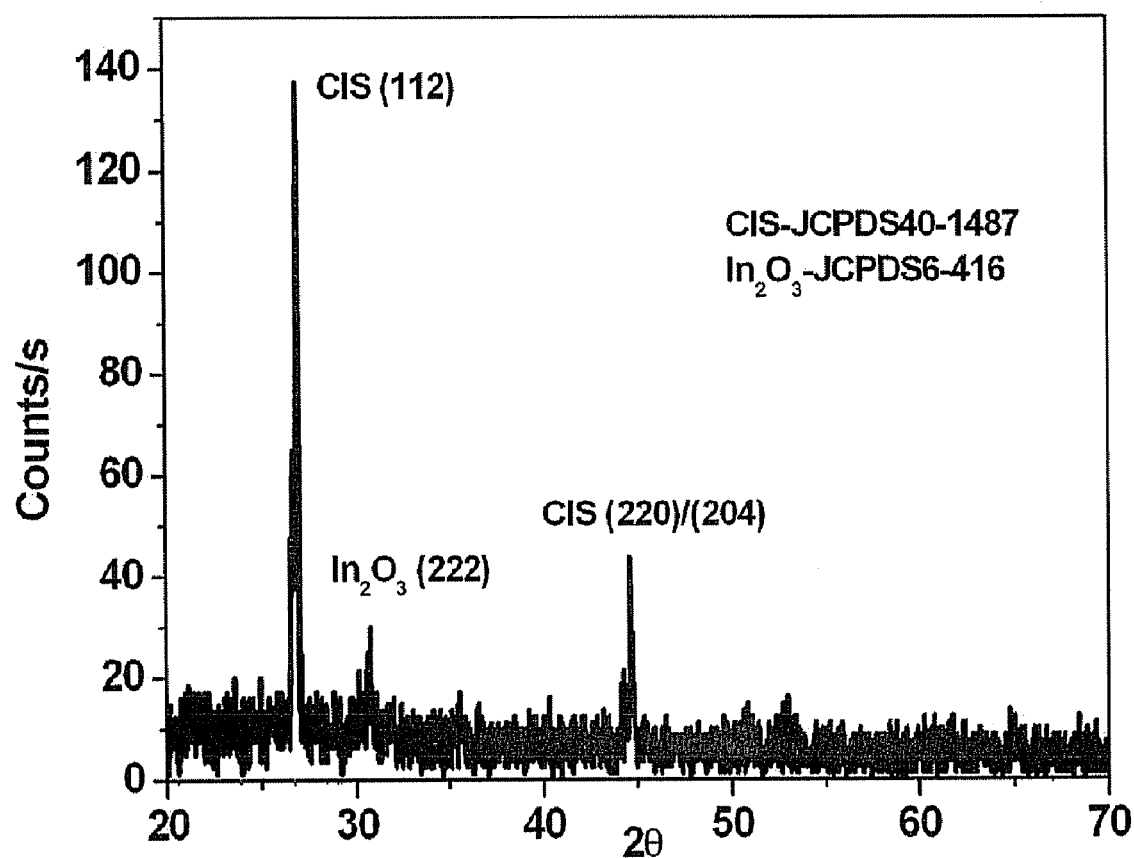
FIG. 10 is an XRD (X-ray Diffraction) graph for CuInSe2 compound prepared in Example 3 of the present invention.

Further, the results of XRD (X-ray Diffraction) analysis are given in FIG. 10. As shown in FIG. 10, it can be seen that desired CIS was synthesized via confirmation of peaks (1 1 2), (2 2 0)/(2 0 4), and (3 1 2), which respectively correspond to CIS, at around 2θ=26.7°, 44.2° and 52.4°.

INDUSTRIAL APPLICABILITY

As apparent from the above description, a process for preparing an absorption layer of a solar cell according to the present invention enables significant reduction of manufacturing processes and fabrication of an absorption layer having a large crystal size, as compared to conventional methods. Therefore, the present invention can realize preparation of a high-efficiency absorption layer and thereby enhanced efficiency of the final solar cell products and further, strengthened competitiveness of solar cell products on markets. Further, the present invention can be widely and effectively applied to solar cells and other electronic devices.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A process for preparing an absorption layer of a solar cell composed of a 1B-3A-Se compound, comprising
    (a) preparing a mixture paste of Group 1B metal selenide particles and Group 3A metal selenide particles as reactants;
    (b) applying the paste to a base material; and
    (c) subjecting the resulting coating layer to rapid thermal processing, wherein the Group 1B metal selenide is a copper selenide (Cu—Se) prepared by adding a copper salt and selenious acid ($H_2SeO_3$) to a solvent and heating the resulting mixture, and the Group 3A metal selenide is an indium selenide (In—Se) and/or gallium selenide (Ga—Se), wherein the indium selenide (In—Se) is prepared by adding an indium salt and selenious acid ($H_2SeO_3$) to a solvent and heating the resulting mixture when the Group 3A metal selenide is indium selenide (In—Se).

2. The process according to claim 1, wherein the metal selenide particles have a particle diameter of 5 nm to 10 μm.

3. The process according to claim 2, wherein the metal selenide particles have a particle diameter of 50 nm to 5 μm.

4. The process according to claim 1, wherein the mole ratio of Cu/(In+Ga) is in the range of 0.6 to 1.5, as the mole ratio of the absorption layer composed of a 1B-3A-Se compound, and the mole ratio of Ga/(Ga+In) is in the range of 0 to 0.5, as the mole ratio of the absorption layer composed of a 1B-3A-Se compound.

5. The process according to claim 1, wherein the coating layer has a monolayer or multilayer structure and has a total thickness of 3 to 5 μm.

6. The process according to claim 5, wherein the coating layer is composed of a trilayer structure, and the bottom first layer has a mole ratio of Cu/(In+Ga)=0 to 0.9 and a thickness of 0.1 to 1.0 μm, the intermediate second layer has a mole ratio of Cu/(In+Ga)=0.8 to 3.0 and a thickness of 0.5 to 3.0 μm, and the top third layer has a mole ratio of Cu/(In+Ga)=0 to 0.9 and a thickness of 0.1 to 1.0 μm.

7. The process according to claim 1, wherein the rapid thermal processing is carried out at a temperature of 400 to 600° C. for 1 to 30 min.

* * * * *